United States Patent [19]

Maerz et al.

[11] Patent Number: 5,683,852
[45] Date of Patent: Nov. 4, 1997

[54] LIGHT-SENSITIVE MATERIAL FOR PRODUCING A MULTI-COLOR IMAGE

[75] Inventors: Karin Maerz, Mainz; Stephan J. W. Platzer, Eltville, both of Germany

[73] Assignee: Agfa-Gevaert AG, Leverkusen, Germany

[21] Appl. No.: 593,484

[22] Filed: Jan. 29, 1996

Related U.S. Application Data

[60] Continuation of Ser. No. 371,212, Jan. 11, 1995, abandoned, which is a division of Ser. No. 212,691, Mar. 14, 1994, Pat. No. 5,443,939, which is a continuation of Ser. No. 915,647, Jul. 21, 1992, abandoned.

[30] Foreign Application Priority Data

Aug. 2, 1991 [DE] Germany ............... 41 25 723.5

[51] Int. Cl.⁶ ........................................... G03F 7/027
[52] U.S. Cl. .................. 430/263; 430/262; 430/253; 430/254; 430/271.1; 430/273.1
[58] Field of Search ........................ 430/253–254, 430/262, 263, 271.1, 273.1

[56] References Cited

U.S. PATENT DOCUMENTS

| | | | |
|---|---|---|---|
| 4,247,619 | 1/1981 | Cohen et al. | 430/253 |
| 4,318,953 | 3/1982 | Smith et al. | 428/200 |
| 4,440,590 | 4/1984 | Collins et al. | 156/234 |
| 4,506,003 | 3/1985 | Ruckert et al. | 430/271 |
| 4,544,619 | 10/1985 | Christensen et al. | 430/273 |
| 4,668,603 | 5/1987 | Taylor, Jr. | 430/253 |
| 4,756,988 | 7/1988 | Kausch et al. | 430/273 |
| 4,889,787 | 12/1989 | Musser | 430/166 |
| 4,895,787 | 1/1990 | Platzer | 430/253 |
| 4,923,780 | 5/1990 | Taylor, Jr. | 430/257 |
| 5,049,476 | 9/1991 | Platzer | 430/253 |
| 5,213,941 | 5/1993 | Platzer | 430/262 |
| 5,443,939 | 8/1995 | Maerz et al. | 430/253 |

FOREIGN PATENT DOCUMENTS

| | | |
|---|---|---|
| 0 104 954 | 4/1984 | European Pat. Off. . |
| 0 339 860 | 11/1989 | European Pat. Off. . |
| 0339860 | 11/1989 | European Pat. Off. . |
| 1188921 | 4/1970 | United Kingdom . |

OTHER PUBLICATIONS

Choi, "Effect of Mechanical Factors on Resolution and Peel Force in a Peel–Apart Imaging Film," *Journal of Imaging Technology* 15(4), pp. 190–195, 1989.

*Primary Examiner*—Martin Angebranndt
*Attorney, Agent, or Firm*—Foley & Lardner

[57] ABSTRACT

A light-sensitive material for producing color-test films for multi-color printing is disclosed. The material has (A) a transparent flexible base film of a plastic, (B) a photopolymerizable layer containing (B1) a polymeric binder, (B2) a compound polymerizable by a free-radical mechanism, (B3) a compound capable of initiating the polymerization of (B2) under the action of actinic light, and (B4) a dye or a colored pigment in one of the basic colors of multi-color printing, and (C) a thermoplastic adhesion layer on the light-sensitive layer is described. A polymer of a vinyl alkyl ether is present in at least one of the layers (B) and (C). The material is processed by lamination to an image-receiving material, with subsequent exposure and peeling-apart of base film and image-receiving material. The unexposed layer areas remain together with the adhesion layer on the image-receiving material. These steps are repeated with at least one further part-color image. The material gives improved image resolution and has improved storage stability in the unexposed state.

19 Claims, No Drawings

LIGHT-SENSITIVE MATERIAL FOR PRODUCING A MULTI-COLOR IMAGE

This application is a continuation of application Ser. No. 08/371,212, filed on Jan. 11, 1995, abandoned, which is a divisional of application Ser. No. 08/212,691, filed on Mar. 14, 1994, now U.S. Pat. No. 5,443,939 which is a continuation of application Ser. No. 07/915,647 filed on Jul. 21, 1992, now abandoned.

BACKGROUND OF THE INVENTION

The present invention relates to a light-sensitive material, especially a photopolymerizable material, for producing color-test films for multi-color printing. It also relates to a color test method, in which a multi-color image is produced on an image-receiving material from a plurality of part-color images in register. The part-color images are produced by laminating a photopolymerizable. layer colored in a main color to the image-receiving material, exposing under the respective color separation, developing the image by peeling off the base film of the photopolymerizable layer together with the non-image areas and repeating the same steps using a photopolymerizable layer in a different main color.

A color test method and a material therefor are known from U.S. Pat. No. 4,895,787. The material is composed of a transparent base film, the surface of which preferably has been pretreated for adhesion promotion, a photopolymerizable layer that contains a dye or a colored pigment in a main color of the multi-colored print, and an adhesion layer, that can be activated by heating, on the photopolymerizable layer. After lamination to an image-receiving material and exposure through the base film, the material is developed by peeling apart the base film and the image-receiving material. The exposed areas of the light-sensitive color layer remain on the base film, and the unexposed areas together with the complete adhesion layer remain on the image-receiving material. The method thus works positively, i.e., a positive image of the original is produced on the image-receiving material.

This processing method has the great advantage that it requires no alkaline or acidic solutions and no organic solvents for development, so that no disposal of these is required. A disadvantage of this method is its lower resolution as compared with a developing method using solutions.

The material properties that affect the resolving power have been investigated and described in a publication by J. H. Choi, *J. of Im. Tech.*, 15(4): 190 (1989). Essentially, these properties are the adhesion forces (a) between the unexposed areas of the photopolymerizable color layer and the base film,
(b) between the exposed areas of the photopolymerizable color layer and the base film, p1 (c) between the unexposed areas of the photopolymerizable color layer and the adhesion layer, and
(d) between the exposed areas of the photopolymerizable color layer and the adhesion layer, and the cohesion forces (e) within the photopolymerizable color layer, and
(f) within the adhesion layer.

The cohesion forces are generally greater than the adhesion forces, but at least greater than the smallest adhesion force in each case. The adhesion force between the adhesion layer and the image-receiving material should likewise be greater than all the other adhesion forces.

A further disadvantage of the known material is its unacceptably low storage stability in many cases. If the material is stored at room temperature in the unexposed state for several weeks, it changes its properties so that the image reproduction after exposure and development deteriorates. This manifests itself in visible defects in the half-tone images, caused by inaccurate tearing out or tearing apart of screen dots. At elevated temperature, this change is observed after one day or a few days.

EP 339,860 discloses a color test method using a material of similar structure, composed of a base film, a light-sensitive pigment-containing layer and an adhesion layer. The individual part-color images are produced by washing out the non-image areas with a developer. Of course, in this method the adhesion of the individual layers does not play the same role as in a peel-apart method. In this case, a polyvinyl ether is added as a plasticizer to the adhesion layer.

SUMMARY OF THE INVENTION

It is therefore an object of the present invention to provide a light-sensitive material and a color test method that has improved image resolution and storage stability.

These and other objects according to the invention are achieved by a light-sensitive material for producing color-test films for multi-color printing comprising (A) a transparent flexible base film of a plastic, (B) a photopolymerizable layer containing (B1) a polymeric binder, (B2) a compound polymerizable by a free-radical mechanism, (B3) a compound which is capable of initiating the polymerization of (B2) under the action of actinic light, and (B4) a dye or a colored pigment in one of the basic colors of multi-color printing, and (C) a thermoplastic adhesion layer on the light-sensitive layer, wherein in at least one of the layers (B) and (C) contains a polymer of a vinyl alkyl ether.

A method of producing a multi-colored image is also provided according to the invention and comprises the steps of laminating a layer of the light-sensitive material under pressure to an image-receiving material; imagewise exposing the laminate through the base film with a color separation; peeling the base film together with the non-image areas from the image-receiving material; and repeating the steps of laminating, exposing and peeling with at least one further color separation, each subsequent exposure taking place in register with a first part-color image produced on the image-receiving material.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

According to the present invention, a light-sensitive material for producing color test films for multi-color printing comprises (A) a transparent flexible base film of a plastic,
(B) a photopolymerizable layer containing
   (B1) a polymeric binder,
   (B2) a compound polymerizable by a free-radical mechanism,
   (B3) a compound capable of initiating the polymerization of (B2) under the action of actinic light, and (B4) a dye or a colored pigment in one of the basic colors of multi-color printing, and (C) a thermoplastic adhesion layer on the light-sensitive layer.

The material according to the invention comprises a polymer of a vinyl alkyl ether in at least one of the layers (B) and (C).

According to another aspect of the invention, a method of producing a multi-color image is proposed, that comprises steps of laminating a light-sensitive material of the composition with the adhesion layer under pressure with an image-receiving material, imagewise exposing the laminate through the base film with a color separation, peeling the base film together with the non-image areas from the image-receiving material and repeating the steps of laminating, exposing and peeling-off with at least one further color separation, the exposure taking place in register with the first part-color image produced on the image-receiving material.

The vinyl alkyl ether polymer can be present in the photopolymerizable layer B or in the adhesion layer C or in both layers. The addition generally effects an increase in the adhesive strength of the corresponding layer. Thus, an addition to the photopolymerizable layer improves both its cohesion and its adhesion to the adhesion layer in the unexposed areas. Addition to the adhesion layer likewise improves that layer's cohesion and adhesion to the unexposed areas of the photopolymerizable layer. By measuring the peeling forces, it can also be established that the adhesion of the unexposed areas of the photopolymerizable layer to the base film and that of the exposed areas to the adhesion layer are not changed by addition of the vinyl ether polymer.

If the vinyl ether polymer is added to the adhesion layer, the adhesion of the latter to the image-receiving material is also increased. This means that conventional printing paper with a dull or glossy coating can be used for this purpose. Without this addition to the adhesion layer, the paper used as receiving material must additionally be provided with an adhesion layer, or a plastic-coated special paper must be used. The application of the adhesion layer to the receiving material not only represents an additional working step, but also enhances the tonal value increase of the color test image and hence changes the color reproduction.

The vinyl alkyl ether polymer can be a homopolymer or a copolymer. The comonomers used can in principle be all vinyl compounds that are copolymerizable with vinyl alkyl ethers. Unsaturated carboxylic acids and derivatives thereof, for example, the esters and amides of $\alpha,\beta$-unsaturated monocarboxylic acids, in particular of acrylic and methacrylic acid, and the anhydrides, esters, partial esters,-imides and amides of dicarboxylic acids, such as maleic acid, fumaric acid or citraconic acid, are preferred. Salts of the acids can also be used. The comonomers can be present in the copolymer in a fraction of up to about 80 mol %. The vinyl alkyl ether generally has an alkyl group with 1 to 8 and preferably 1 to 4 carbon atoms, and vinyl methyl ether is particularly preferred, since it gives water-soluble polymers. Generally the vinyl alkyl ether homopolymers are preferred over the copolymers.

The quantity of the vinyl ether polymer present in the photopolymerizable layer or in the adhesion layer is generally about 1 to 10 and preferably about 2 to 5% by weight, relative to the non-volatile layer constituents.

The addition of the vinyl ether polymer to the adhesion layer generally has a greater effect than an addition to the photopolymerizable layer. If the adhesion layer is, as frequently preferred, to be applied from an aqueous solution to the photopolymerizable layer, in order to avoid incipient dissolution of constituents of the latter, the vinyl ether polymer must be water-soluble. In this case, polyvinyl methyl ether is particularly suitable. Other water-insoluble vinyl ether polymers must then be added to the photopolymerizable layer, if coating from a homogeneous solution is intended. It is also possible, however, to use aqueous dispersions of these polymers and other water-insoluble polymers for coating.

The photopolymerizable layer of the material according to the invention contains, as essential constituents, a polymeric binder, a compound polymerizable by a free-radical mechanism, a compound that forms free radicals under the action of actinic light and thus initiates the polymerization of the polymerizable compound, and a dye or a colored pigment in one of the basic colors of the multi-color printing. Examples of photopolymerizable layers of this composition are described in U.S. Pat. No. 4,895,787, the contents of which are incorporated herein by reference.

The polymeric binder is intended to confer homogeneity and strength on the layer. Suitable binders are styrene/maleic anhydride copolymers and styrene/maleic acid half-ester copolymers, acrylate ester polymers and copolymers, polyamides, polyvinylpyrrolidones, cellulose derivatives such as cellulose esters and ethers, phenolic resins, polyvinyl esters, polyvinyl acetals, for example, polyvinyl butyral, propional or formal. The quantitative fraction of the binder is generally about 15 to 70 and preferably about 20 to 50% by weight, relative to the weight of the solid layer.

The polymerizable compound contains at least one and preferably at least two terminal double bonds capable of polymerization by a free-radical mechanism, and is not gaseous below 100° C. under normal pressure. Esters and amides of acrylic and methacrylic acid are preferred. The esters with polyhydric alcohols are used with particular advantage. Examples are di-, tri-, tetra- and poly-ethylene glycol di(meth)acrylate, the di(meth)acrylates of oligopropylene and polypropylene glycols, 1,4-butane-diol di(meth)acrylate, the di- and tri-(meth)acrylates of trimethylolpropane and trimethylolethane, pentaerythritoltri- and tetraacrylate or tetramethacrylate, and dipentaerythritol tetra-, penta- and hexa-(meth)acrylate. The quantitative fraction of polymerizable compound is generally about 15 to 70 and preferably about 20 to 60% by weight, relative to the weight of the solid layer.

Suitable photoinitiators are essentially all the compounds or compound combinations known for this purpose. Examples are benzoin ethers, benzil ketals, polynuclear quinones, benzophenone derivatives, triarylimidazolyl dimers and light-sensitive trihalogenomethyl compounds, for example, trichloromethyl-s-triazines. 2,3-Bis-arylquinoxalines, such as are described in U.S. Pat. No. 3,765,898, and 2-aryl-4,6-bis-trichloromethyl-s-triazines are particularly preferred. The quantity of photoinitiator or photoinitiator combination is generally between about 1 and 25% by weight, and preferably between about 5 and 15% by weight, relative to the weight of the solid layer. The dyes and/or colored pigments are selected so that they correspond to the basic colors of the multi-color printing, namely cyan (blue-green), magenta (purple), yellow and black. Pigments are generally preferred. Examples are Permanent Yellow G (C.I. 21,095), Permanent Yellow GR (C.I. 21,100), Permanent Yellow DHG (C.I. 21,090), Permanent Ruby L3B (C.I. 15,850:1), Permanent Pink F3B (C.I. 12,433), Hostaperm Pink E (C.I. 73,915), Hostaperm Red-violet ER (C.I. 46,500), Permanent Carmine FBB (C.I. 12,485), Hostaperm Blue B2G (C.I. 74,160), Hostaperm Blue A2R (C.I. 74,160) and Printex 25 (carbon black). If necessary, the pigments can be blended to obtain the desired color shade. The inorganic or organic pigments are generally dispersed or pasted together with a part of the binder in a suitable solvent. The mean particle size is generally below about 1 µm.

The quantitative fraction of the dye or pigment is generally about 8 to 40 and preferably 12 to 30% by weight, relative to the weight of the solid layer.

If desired, the photopolymerizable layer can contain further constituents such as hydrogen donors, sensitizers, polymerization inhibitors, plasticizers, residual solvents, surfactants, planarizing agents, lubricants, antistatics, inert fillers, optical brighteners and/or UV absorbers. The layer generally has a weight of about 0.2 to 5 and preferably about 0.3 to 3 g/m².

After the photopolymerizable layer has been dried, a heat-activatable thermoplastic adhesion layer is applied. This can be applied directly to the latter either from a solvent or a solvent mixture that does not incipiently dissolve the photopolymerizable layer and dried. It can also be first applied to a temporary support film and then transferred to the photopolymerizable color layer by laminating and peeling off the support film. According to another embodiment, the adhesion layer can be obtained by coating the image-receiving material from a solvent and drying. The photopolymerizable layer is then transferred by lamination to the adhesion layer thus obtained. Direct application from solvents to the photopolymerizable layer is preferred. Suitable solvents that do not incipiently dissolve the color layer include water and saturated hydrocarbons. Many polymers can be applied from aqueous dispersions; application from a solution is, however, preferred. Suitable examples thereof are salts of a polymer having acid groups, for example, carboxyl groups, A preferred example is an aqueous-alkaline solution of a vinyl acetate/crotonic acid copolymer (Mowilith Ct 5). Other suitable polymers are dispersions of a polyvinyl acetate or polyacrylate. The polymer should have a softening point in the range from about 40 to 200 and preferably in the range from about 60° to 120° C. In addition to the thermoplastic polymer and the vinyl ether polymer, the adhesion layer can also contain plasticizers, residue dissolvers, planarizing agents, surfactants, lubricants, antistatics, inert fillers, optical brighteners and/or UV absorbers. Its layer weight in the dry state is normally about 2 to 30 and preferably about 4 to 15 g/m². Suitable adhesion layers have also been described in U.S. Pat. No. 4,895,787.

The base films used are transparent, flexible, dimensionally-stable films or plastics, for example, polyesters, polycarbonates and the like. Polyester films, especially biaxially-stretched and heat-set films, for example, of polyethylene terephthalate, are particularly preferred. These should remain dimensionally stable at the required lamination temperatures, i.e., from about 60° to 150° C. Their thickness is generally about 10 to 200 and preferably about 25 to 80 µm. The base film is advantageously subjected to an adhesion-promoting pretreatment on one or both sides and can have a smooth surface or a rough or dull surface, but preferably it has a smooth surface.

For carrying out the method according to the invention, the light-sensitive material described above is laminated with the adhesion layer to an image-receiving material. This can be composed of a plastic, plastic-coated special paper or of normal printing paper. Other white and, in some cases, even non-white receiving materials can also be used. A printing paper that is dimensionally stable under the lamination conditions is generally preferred, since this gives a visual impression that comes very close to the later print. The lamination is advantageously carried out in an apparatus intended for this purpose, under pressure and at an elevated temperature. The lamination temperature is usually in the range from about 60° to 130° C. and preferably between about 70° and 100° C. After lamination, the photopolymerizable layer is imagewise exposed in a known manner through the base film, generally in contact under a positive color separation. After exposure, the base film is peeled by hand or in a suitable device. The peeling angle should be at least 90°, and an angle of 180° is particularly preferred. In this way the exposed areas of the photopolymerizable layer are removed together with the base film, while the unexposed areas together with the complete adhesion layer remain on the image-receiving material. A positive part-color image is obtained in this way. Any further color test film is laminated to the preceding part-color image in the manner described, exposed there in register and developed by peeling off the base film. Thus, a complete multi-color image corresponding to the later 4-color print image is produced from the part-color images in the colors cyan (blue-green), magenta (purple), yellow and black. If required, color test films in special colors can also be used.

The finished multi-color image has a glossy surface. If desired, the surface can be dulled, for example, by laminating a film having a rough surface to the glossy layer surface and peeling it off again. The surface of the finished test image can be protected by a protective layer from scratching or sticking at higher temperatures.

The invention is explained by the examples which follow. All percentage data and quantitative ratios are in units by weight. Examples 1 and 3 are comparison examples without the additive according to the invention or with other additives. By contrast, Example 2 demonstrates the advantages of the invention.

EXAMPLE 1 (COMPARISON EXAMPLE)

The coating solutions for the photopolymerizable layers are composed of the following components, in parts by weight:

|  | Cyan | Magenta | Yellow | Black |
| --- | --- | --- | --- | --- |
| Dipentaerythritol penta-acrylate | 19.9 | 25.0 | 21.6 | 19.9 |
| 2,3-Bis-(4-methoxy-phenyl)-quinoxaline | 5.1 | 6.1 | 5.4 | 5.3 |
| Polyvinyl formal (Formvar ® 12/85) | 16.3 | 23.0 | 18.4 | 14.2 |
| Hostaperm ® Blue B2G (C.I. 74,160) | 9.7 | — | — | — |
| Permanent Red FBB (C.I. 12,485) | — | 12.9 | — | — |
| Permanent Yellow GR (C.I. 21,100) | — | — | 8.6 | — |
| Carbon black (Printex ® 25) | — | — | — | 13.6 |
| Tetrahydrofuran | 398.6 | 363.9 | 382.4 | 378.8 |
| 4-Hydroxy-4-methyl-2-pentanone | 113.9 | 121.3 | 124.3 | 123.1 |
| 1-Methoxy-2-propanol | 360.6 | 326.5 | 353.7 | 331.5 |
| γ-Butyrolactone | 75.9 | 121.3 | 86.0 | 113.6 |

The pigments are dispersed with a part of the binder and of the butyrolactone. The mean particle size is below 200 nm. The dispersion and the other constituents are mixed and applied to a 50 µm thick, biaxially-stretched and heat-set polyethylene terephthalate film (Melinex® 505) which has been pretreated on both sides to improve its adhesion. The layers are dried at 70° C. The layer weights are between 0.6 and 0.8 g/m².

The adhesion layer solution is composed as follows:

| | |
|---|---|
| Vinyl acetate/crotonic acid copolymer 95:5 (Mowilith® CT5) | 50.0 parts by weight |
| Water | 253.3 parts by weight |
| Ethanol | 24.0 parts by weight |
| Aqueous ammonia, 25% | 5.0 parts by weight |
| Sodium sulfite | 0.7 part by weight |

The solution is applied to the dry photopolymerizable layers and dried. The layer weight of the dry adhesion layer is 6 g/m².

One of the films prepared in this way, for example, the cyan color film, is laminated at 85° C. to plastic-coated special paper and exposed under the cyan color separation film. The base film is peeled off by hand continuously at an angle of 180°. The adhesion layer and the positive cyan image, to which the further color films are laminated one after the other, remain on the paper.

The tonal value range in a screen of 60 lines/cm is 4–96% for the colors and 3–97% in the case of black, i.e., the screen dots of a size corresponding to the indicated area coverage in percent, are still reproduced. Visible tear-out phenomena at the image points appear during processing after storage for only 24 hours of the unexposed film at 48° C. Under magnification, tearing apart of the contours of the screen dots and destruction of the surface of the adhesion layer in the surroundings thereof is discernable after peeling. Conventional printing papers (e.g., Chromolux® 500/250) cannot be used as the base material, due to the poor adhesion of the adhesion layer. In this case, pretreatment of the paper with an additional adhesion layer is necessary, such as is described, for example, in EP 0,365,358.

EXAMPLE 2

The composition of the photopolymerizable color layers corresponds to the data in Example 1; however, vinyl ether polymers as adhesion promoters are added to the color layer and/or to the adhesion layer. The further processing and use of the films is as in Example 1. Tables 2.1–2.4 show the concentrations used in each case and the tonal value range in a screen of 60 lines/cm ($c_A$=concentration of the adhesion promoter in the adhesion layer, $c_F$=concentration of the adhesion promoter in the color layer; both data in percent by weight of the solids content of the particular layer). The storage stability and/or thermal stability are assessed on the basis of the screen dot form. The period indicated shows the point in time when the tearing-apart, described in Example 1, of the screen dot contours appears (storage temperature 50° C). The storage stability was tested in all cases on the magenta film. In a number of cases, the films of the other colors (yellow and cyan) and the black film were also tested. In this case, the same results as with the magenta film were always obtained. If applicable, the further colors for which the storage stability was determined are indicated in brackets after the time figure.

In the tables:

C=cyan
Y=yellow
K=black

2.1 Polyvinyl methyl ether $M_w = 70,000$ (Lutonal® M40, BASF)

| No. | $C_A$ | $C_F$ | Tonal value range | Thermal stability (50° C.) |
|---|---|---|---|---|
| 2.1.1 | 1.0 | — | 3–98% | >48 hours (C) |
| 2.1.2 | 2.0 | — | 2–98% | >7 weeks (C,Y,K) |
| 2.1.3 | 5.0 | — | 2–98% | >7 weeks (C,Y,K) |
| 2.1.4 | 10.0 | — | 4–98% | >7 weeks (C) |
| 2.1.5 | 2.0 | 2.0 | 2–98% | >7 weeks |
| 2.1.6 | — | 2.5 | 2–97% | >24 hours |
| 2.1.7 | — | 5.0 | 2–98% | >24 hours |

2.2 Polyvinyl ethyl ether, $M_w = 5,800$ (Lutonal® A25, BASF)

| No. | $C_A$ | $C_F$ | Tonal value range | Thermal stability (50° C.) |
|---|---|---|---|---|
| 2.2.1 | — | 1.0 | 3–97% | >4 days (C,K) |
| 2.2.2 | — | 2.5 | 2–97% | >4 days (C,K) |
| 2.2.3 | — | 5.0 | 2–98% | >7 days (C,K) |

2.3 Copolymeric vinyl methyl ether/maleic anhydride $M_w = 41,000$ (Gantrezk® AN139, GAF)

| No. | $C_A$ | $C_F$ | Tonal value range | Thermal stability (50° C.) |
|---|---|---|---|---|
| 2.3.1 | — | 2.0 | 3–98% | >48 hours |
| 2.3.2 | — | 5.0 | 2–97% | >24 hours |

2.4 Copolymeric vinyl isobutyl ether/acrylate Acronal® 700L, BASF)

| No. | $C_A$ | $C_F$ | Tonal value range | Thermal stability (50° C.) |
|---|---|---|---|---|
| 2.4.1 | — | 1.0 | 3–98% | >65 hours |
| 2.4.1 | — | 2.5 | 2–98% | >65 hours |
| 2.4.3 | — | 5.0 | 2–98% | >65 hours |

Tables 2.1 to 2.4 clearly show the advantages of the use of an adhesion promoter:

(1) The resolving power is improved. In the case of all four colors, a tonal value range of 2–98% can be reached in a screen of 60 lines/cm.

(2) The thermal stability is improved.

With increasing concentration of the adhesion promoter in the adhesion layer, the adhesion of the color test film on printing paper (Chromolux® 500/250) is also improved, so that the use of plastic-coated special papers or additional paper adhesion layers is no longer necessary (Examples 2.1.1–2.1.4 on printing paper). However, the surface tackiness of the adhesion layer increases at the same time; the most preferred concentration of the adhesion promoter is therefore 2–5%, relative to the solids content of the adhesion layer.

EXAMPLE 3

The solutions for the photopolymerizable color layers correspond to the data of Example 2. In place of the adhesion promoters, the following plasticizers are used both in the color layer and in the adhesion layer. The further processing and use of the films is as described in Example 1.

(3a) The vinyl ether polymer in the color layer is replaced by the same quantity of dibutyl phthalate. As compared with the additive-free sample from Example 1, neither a positive influence nor a negative influence on the resolution or thermal stability is found.

(3b) The vinyl ether polymer in the color layer is replaced by the same quantity of a polymeric plasticizer, for example by a polydiethylene glycol adipate (Resoflex® R296 from Cambridge Ind.) or by another polyester (Paraplex® WP1 from Rohm and Haas). In the case of an addition of Resoflex® R296, a marked deterioration of the resolving power, connected with a loss of image area, takes place. Paraplex® WP1 shows no influence whatsoever.

(3c) The polyvinyl methyl ether in the adhesion layer is replaced by various polyglycols having molecular weights between 2,000 and 20,000 as water-soluble plasticizers. After storage of the coated films for 24 hours at 48° C., a marked deterioration of the resolution and a decrease in light sensitivity are found.

What is claimed is:

1. A light-sensitive material for producing color-test films for multi-color printing for producing a positive image by a peel-apart process consisting essentially of:
   (A) a transparent flexible base film of a plastic,
   (B) a photopolymerizable layer consisting essentially of
      (B1) a polymeric binder,
      (B2) a compound polymerizable by a free-radical mechanism,
      (B3) a compound capable of initiating the polymerization of (B2) under the action of actinic light, and
      (B4) from about 8 to about 40% by weight, relative to the weight of the solid layer, of a dye or a colored pigment in one of the main colors of the multi-color print, and
   (C) a thermoplastic adhesion layer on the light-sensitive layer, which adhesion layer comprises
      (C1) a salt of a polymer having acid groups, a polyvinyl acetate or a polyacrylate, and
      (C2) a polymer of a vinyl alkyl ether in a quantity from about 1 to 10% by weight, relative to the non-volatile constituents of the layer,
   wherein a polymer of a vinyl alkyl ether is present only in layer (C) and wherein the thermoplastic adhesion layer has a glass temperature Tg of from about 20° to 60° C.

2. The light-sensitive material as claimed in claim 1, wherein the vinyl alkyl ether polymer is a homopolymer of a vinyl alkyl ether.

3. The light-sensitive material as claimed in claim 1, wherein the vinyl alkyl ether polymer is a copolymer of a vinyl alkyl ether with a derivative of an alkenyl carboxylic acid.

4. The light-sensitive material as claimed in claim 1, wherein the vinyl alkyl ether polymer has an alkyl group with 1 to 4 carbon atoms.

5. The light-sensitive material as claimed in claim 1, wherein the vinyl alkyl ether polymer is water-soluble.

6. The light-sensitive material as claimed in claim 1, wherein the thermoplastic adhesion layer has a weight of from about 2 to 30 g/m$^2$.

7. The light-sensitive material as claimed in claim 1, wherein the photopolymerizable layer has a weight of from about 0.2 to 5 g/m$^2$.

8. The light-sensitive material as claimed in claim 1, wherein the dye is present in an amount of about 12 to 30% by weight, relative to the weight of the solid layer.

9. The light-sensitive material as claimed in claim 1, wherein the polymer of vinyl alkyl ether is present in an amount of about 2 to 5% by weight, relative to the non-volatile layer constituents.

10. The light-sensitive material as claimed in claim 8, wherein the polymer of vinyl alkyl ether is present in an amount of about 2 to 5% by weight, relative to the non-volatile layer constituents.

11. The light-sensitive material as claimed in claim 1, consisting of components (A), (B) and (C).

12. The light-sensitive material as claimed in claim 1, wherein (C1) is a vinyl acetate/crotonic acid copolymer.

13. The light-sensitive material as claimed in claim 1, wherein layer (C) consists essentially of components (C1) and (C2).

14. The light-sensitive material as claimed in claim 1, wherein (C1) is a salt of a polymer having acid groups.

15. The light-sensitive material as claimed in claim 1, wherein (C1) is a polyvinyl acetate.

16. The light-sensitive material as claimed in claim 1, wherein (C1) is a polyacrylate.

17. The light-sensitive material as claimed in claim 1, wherein the polymer of vinyl alkyl ether is polyvinyl methyl ether.

18. The light-sensitive material as claimed in claim 1, wherein (C1) is a salt of a polymer having acid groups or a polyvinyl acetate.

19. The light-sensitive material as claimed in claim 1, wherein layer (C) is water soluble.

* * * * *